(12) United States Patent
Kuroiwa et al.

(10) Patent No.: US 10,522,289 B2
(45) Date of Patent: Dec. 31, 2019

(54) ELECTRONIC COMPONENT AND ELECTRONIC COMPONENT SERIES INCLUDING THE SAME

(71) Applicant: Murata Manufacturing Co., Ltd., Nagaokakyo-shi, Kyoto-fu (JP)

(72) Inventors: Shinichiro Kuroiwa, Nagaokakyo (JP); Kazuo Hattori, Nagaokakyo (JP); Isamu Fujimoto, Nagaokakyo (JP); Yasuyuki Sekimoto, Nagaokakyo (JP)

(73) Assignee: MURATA & MANUFACTURING CO., LTD., Kyoto (JP)

( * ) Notice: Subject to any disclaimer, the term of this patent is extended or adjusted under 35 U.S.C. 154(b) by 427 days.

(21) Appl. No.: 15/067,882

(22) Filed: Mar. 11, 2016

(65) Prior Publication Data
US 2016/0276106 A1   Sep. 22, 2016

(30) Foreign Application Priority Data

Mar. 19, 2015   (JP) .................................. 2015-055904

(51) Int. Cl.
*H01G 4/228* (2006.01)
*H01G 4/30* (2006.01)
*H05K 1/18* (2006.01)

(52) U.S. Cl.
CPC .............. *H01G 4/228* (2013.01); *H01G 4/30* (2013.01); *H05K 1/181* (2013.01); *H05K 2201/10015* (2013.01)

(58) Field of Classification Search
CPC ...................................................... H01G 4/228
USPC ...................................................... 174/260
See application file for complete search history.

(56) References Cited

U.S. PATENT DOCUMENTS

| 6,586,843 B2 * | 7/2003 | Sterrett .................. H01L 24/11 174/257 |
| 2005/0024538 A1 | 2/2005 | Park et al. |
| 2008/0081200 A1 | 4/2008 | Katsube et al. |

(Continued)

FOREIGN PATENT DOCUMENTS

| CN | 102779642 A | 11/2012 |
| CN | 103971931 A | 8/2014 |

(Continued)

OTHER PUBLICATIONS

Official Communication issued in corresponding Korean Patent Application No. 10-2016-0030216, dated Apr. 13, 2017.

*Primary Examiner* — Stanley Tso
(74) *Attorney, Agent, or Firm* — Keating & Bennett, LLP

(57) ABSTRACT

An electronic component includes a component main body including an embedded internal conductor and an outer electrode. The component main body includes an end surface on which the internal conductor is exposed, and a main surface that is continuous with the end surface and intersects with the end surface. The outer electrode includes an end surface covering portion connected to the internal conductor by covering at least a portion of the internal conductor exposed on the end surface, and a main surface covering portion that covers at least a portion of the main surface. At least a portion of an exposed surface of the main surface covering portion includes a Sn plating layer, and at least a portion of an exposed surface of the end surface covering portion includes a Sn—Ni layer.

20 Claims, 11 Drawing Sheets

(56) References Cited

U.S. PATENT DOCUMENTS

| | | | |
|---|---|---|---|
| 2009/0086406 A1* | 4/2009 | Lee | H01G 4/228 361/306.3 |
| 2009/0190285 A1* | 7/2009 | Kusano | H01G 4/232 361/321.4 |
| 2011/0198115 A1 | 8/2011 | Azuma et al. | |
| 2012/0288724 A1 | 11/2012 | Ogawa et al. | |
| 2012/0288731 A1 | 11/2012 | Motoki et al. | |
| 2012/0313489 A1 | 12/2012 | Shirakawa et al. | |
| 2013/0020913 A1 | 1/2013 | Shirakawa et al. | |
| 2013/0057112 A1 | 3/2013 | Shirakawa et al. | |
| 2014/0047966 A1* | 2/2014 | Oowada | B26D 1/015 83/448 |
| 2014/0211368 A1* | 7/2014 | Fujii | H01G 4/012 361/301.4 |
| 2014/0321025 A1 | 10/2014 | Saito et al. | |
| 2015/0021077 A1* | 1/2015 | Chae | H01G 4/30 174/260 |
| 2015/0090483 A1* | 4/2015 | Moon | H01G 4/30 174/260 |
| 2017/0042029 A1* | 2/2017 | Nishimura | H01G 4/30 |

FOREIGN PATENT DOCUMENTS

| | | | |
|---|---|---|---|
| JP | 08-330174 A | 12/1996 | |
| JP | 3341534 | * 12/1996 | H01G 4/12 |
| JP | H08330174 | * 12/1996 | |
| JP | 2003-22929 A | 1/2003 | |
| JP | 2006-339536 A | 12/2006 | |
| JP | 2011-171436 A | 9/2011 | |
| JP | 2012-237033 A | 12/2012 | |
| JP | 2012-238784 A | 12/2012 | |
| JP | 2012-256758 A | 12/2012 | |
| JP | 2013-26392 A | 2/2013 | |
| JP | 2013-58558 A | 3/2013 | |
| JP | 2014-160800 A | 9/2014 | |
| KR | 10-2014-0106733 A | 9/2014 | |

* cited by examiner

ELECTRONIC COMPONENT AND ELECTRONIC COMPONENT SERIES INCLUDING THE SAME

BACKGROUND OF THE INVENTION

1. Field of the Invention

The present invention relates to electronic components and electronic component series including the same, and particularly relates to electronic components mounted using solder and electronic component series including the same.

2. Description of the Related Art

Japanese Unexamined Patent Application Publication No. 2003-22929 is an example of a document disclosing a multilayer ceramic capacitor that suppresses internal electrode layers from shorting due to cracks caused by thermal contraction in solder fillets.

In the multilayer ceramic capacitor disclosed in Japanese Unexamined Patent Application Publication No. 2003-22929, a positional relationship is defined between internal electrode layers and a pair of outer electrodes so that in the case where tensile stress caused by thermal contraction in the solder fillets produces a crack in an element housing near one of the outer electrodes, the crack does not spread to an internal electrode layer connected to the other outer electrodes. This suppresses the internal electrode layers from shorting due to moisture entering into the cracks.

However, in the case where tensile stress caused by thermal contraction in the solder fillets produces a crack in the element housing near one of the outer electrodes, there is a problem in that if the crack spreads to the internal electrode layer connected to the one outer electrode and the outer electrode is disconnected as a result, the electrostatic capacitance of the multilayer ceramic capacitor will drop.

In this manner, the electrical characteristics of electronic component can be affected in a variety of ways when cracks are produced in the main body of an electronic component, and it is thus important to suppress cracks from arising in the component main body due to thermal contraction of the solder fillets.

SUMMARY OF THE INVENTION

Accordingly, preferred embodiments of the present invention provide an electronic component capable of suppressing or preventing cracks from being produced in a component main body due to thermal contraction of a solder fillet, and an electronic component series including such an electronic component, having been achieved in light of the above-described problems.

According to a preferred embodiment of the present invention, an electronic component includes a component main body in which an internal conductor is embedded, and an outer electrode provided on an outer surface of the component main body. The component main body includes an end surface on which the internal conductor is exposed, and a main surface that is continuous with the end surface and intersects with the end surface. The outer electrode includes an end surface covering portion connected to the internal conductor by covering at least a portion of the internal conductor exposed on the end surface, and a main surface covering portion that covers at least a portion of the main surface. In the electronic component according to this preferred embodiment of the present invention, at least a portion of an exposed surface of the main surface covering portion is a Sn plating layer, and at least a portion of an exposed surface of the end surface covering portion is a Sn—Ni layer containing an intermetallic compound of Sn and Ni.

In an electronic component according to another preferred embodiment of the present invention, it is preferable that a surface of the Sn—Ni layer of the exposed surface of the end surface covering portion include a plurality of projections.

In an electronic component according to another preferred embodiment of the present invention, it is preferable that the projections have flat or substantially flat flake shapes.

In an electronic component according to another preferred embodiment of the present invention, it is preferable that the end surface covering portion include a Ni plating layer, and the Sn—Ni layer of the exposed surface of the end surface covering portion provided on the Ni plating layer.

In an electronic component according to another preferred embodiment of the present invention, it is preferable that the main surface covering portion include a Ni plating layer, a Sn—Ni layer provided on the Ni plating layer, and the Sn plating layer of the exposed surface of the main surface covering portion provided on the Sn—Ni layer.

In an electronic component according to another preferred embodiment of the present invention, it is preferable that the end surface covering portion and/or the main surface covering portion include a Cu-containing layer containing Cu and the Ni plating layer provided on the Cu-containing layer.

In an electronic component according to another preferred embodiment of the present invention, it is preferable that an exposed surface on an end portion of the main surface covering portion, the end portion being a portion that intersects with the main surface, be a Sn—Ni layer containing an intermetallic compound of Sn and Ni.

In an electronic component according to another preferred embodiment of the present invention, the Sn plating layer of the exposed surface of the main surface covering portion may extend from the main surface covering portion to a portion of the end surface covering portion.

In an electronic component according to another preferred embodiment of the present invention, it is preferable that the internal conductor be not located on an imaginary plane that follows the shortest path between an edge portion on the end surface covering portion and an edge portion on the main surface covering portion of the Sn plating layer extending from the main surface covering portion to a portion of the end surface covering portion.

According to another preferred embodiment of the present invention, an electronic component series includes a plurality of the electronic components according to other preferred embodiments of the present invention, and further includes a package including an elongated-shaped carrier tape provided with a plurality of recesses with intervals therebetween, and a cover tape affixed to the carrier tape so as to cover the plurality of recesses. In the electronic component series according to this preferred embodiment of the present invention, the plurality of electronic components are accommodated in corresponding recesses such that the main surface of each electronic component faces a base portion of the corresponding recess.

According to various preferred embodiments of the present invention, electronic components capable of suppressing or preventing cracks from forming in the component main body due to thermal contraction of a solder fillet, and an electronic component series including the same, are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
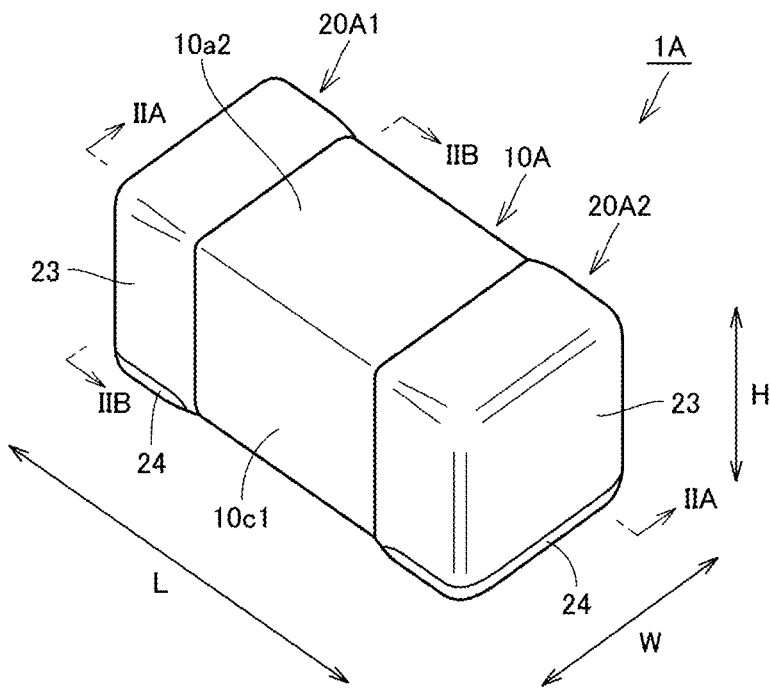
FIGS. 1A and 1B are perspective views illustrating a multilayer ceramic capacitor according to a first preferred embodiment of the present invention.

Hereinafter, preferred embodiments of the present invention will be described in detail with reference to the drawings. The following preferred embodiments will describe a multilayer ceramic capacitor and a multilayer ceramic capacitor series including the same as examples of an electronic component and an electronic component series including the same, respectively, in which the present invention is applied. Note that in the following preferred embodiments, identical reference numerals are assigned to identical or common elements in the drawings, and descriptions thereof will be omitted.

First Preferred Embodiment

Figure 1B:
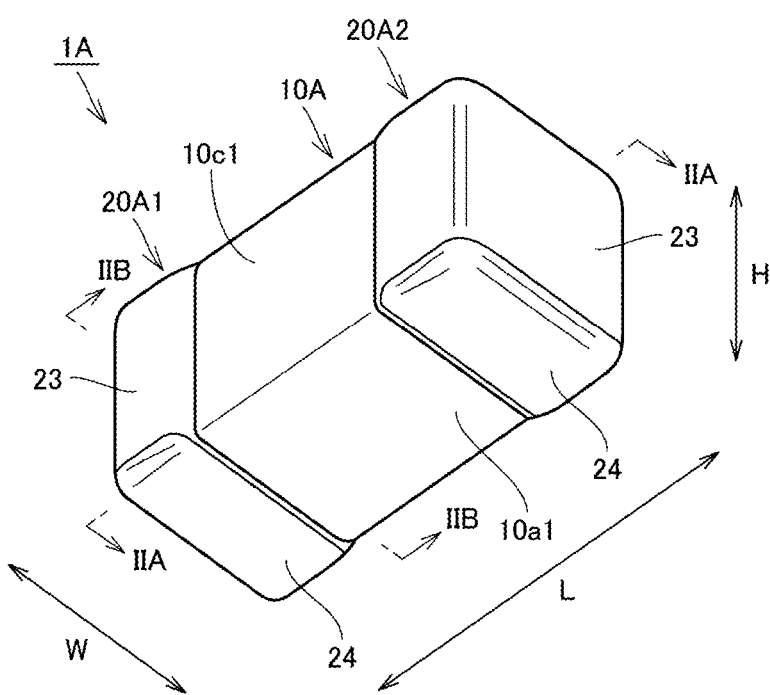
Figure 2A:
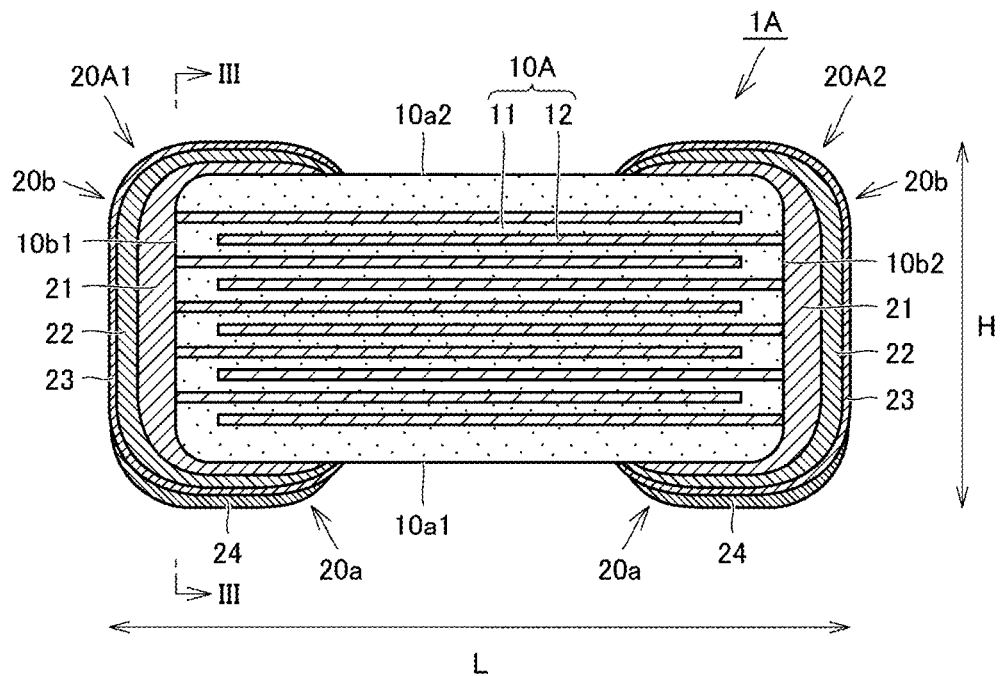
FIGS. 2A and 2B are schematic cross-sectional views respectively taken along a IIA-IIA line and a IIB-IIB line indicated in FIGS. 1A and 1B.
Figure 2B:
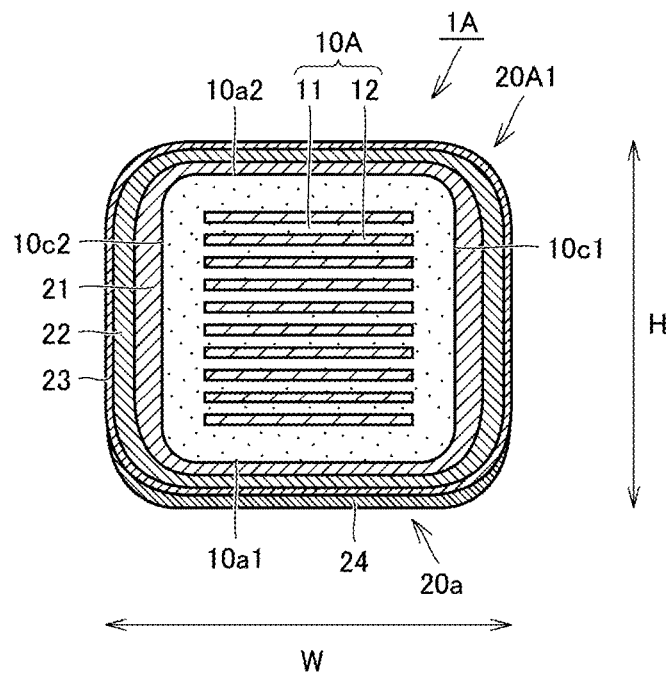
Figure 3:
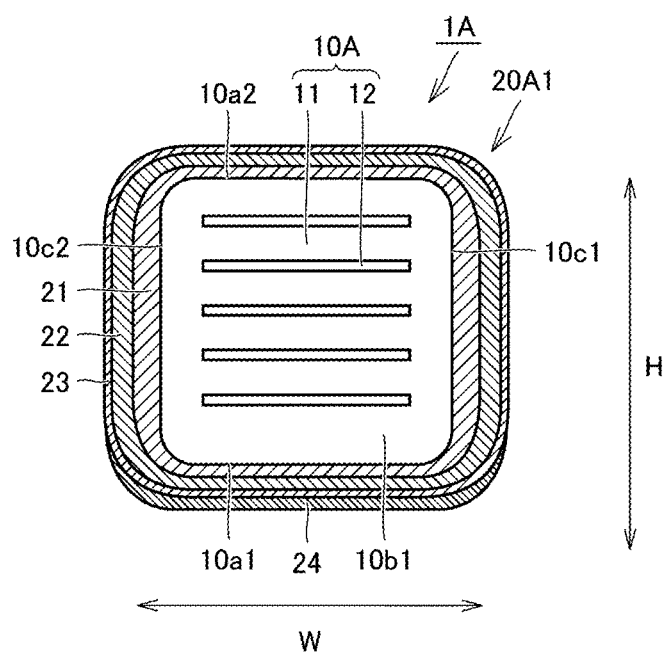
FIG. 3 is a schematic cross-sectional view taken along a III-III line indicated in FIG. 2A.

FIGS. 1A and 1B are perspective views illustrating a multilayer ceramic capacitor according to a first preferred embodiment of the present invention. FIGS. 2A and 2B are schematic cross-sectional views respectively taken along a IIA-IIA line and a IIB-IIB line indicated in FIGS. 1A and 1B. FIG. 3 is a schematic cross-sectional view taken along a III-III line indicated in FIG. 2A. First, the configuration of a multilayer ceramic capacitor 1A according to the present preferred embodiment will be described with reference to FIGS. 1A to 3.

As illustrated in FIGS. 1A to 3, the multilayer ceramic capacitor 1A is an electronic component having an overall substantially rectangular parallelepiped shape, and includes an element housing 10A defining and functioning as a component main body and first and second outer electrodes 20A1 and 20A2 defining and functioning as outer electrodes. The element housing 10A has an elongated-shaped substantially rectangular parallelepiped shape, and the first and second outer electrodes 20A1 and 20A2, which are formed as layers on the outer surface thereof, are distanced from each other.

The "substantially rectangular parallelepiped shape" referred to here includes the multilayer ceramic capacitor 1A and the element housing 10A including rounded corner portions and ridge portions, the multilayer ceramic capacitor 1A and the element housing 10A being provided with steps, non-planarities, or the like in their outer surfaces, and so on.

As illustrated in FIGS. 2A and 2B, the element housing 10A includes a plurality of dielectric material layers 11 and a plurality of conductive material layers 12 laminated in an alternating manner along a predetermined direction. The dielectric material layers 11 preferably are formed from a ceramic material that has barium titanate, for example, as a primary component. The dielectric material layers 11 may include a Mn compound, a Mg compound, a Si compound, a Co compound, a Ni compound, a rare earth compound, or the like as secondary components. The conductive material layers 12 preferably are formed of a metal material such as Ni, Cu, Ag, Pd, a Ag—Pd alloy, Au, or the like, for example.

The element housing 10A is manufactured by preparing a plurality of raw material sheets in which a conductive paste that will define and function as the conductive material layers 12 is printed onto the surface of a ceramic sheet (what is known as a "green sheet") that will define and function as the dielectric material layers 11, layering the plurality of raw material sheets, and then pressure-bonding and firing the sheets.

Note that the material of the dielectric material layers 11 is not limited to the ceramic material that includes barium titanate as a primary component, and another ceramic material (a material that takes $CaTiO_3$, $SrTiO_3$, $CaZrO_3$, or the like as a primary component, for example) may be selected as the material for the dielectric material layers 11. Likewise, the material of the conductive material layers 12 is not limited to the above-described metal material, and another conductive material may be selected as the material of the conductive material layers 12.

The first and second outer electrodes 20A1 and 20A2 are formed by conductive layers, namely a sintered metal layer and plating layers, being laminated together. The sintered metal layer defines and functions as a base layer for the plating layers, and preferably is a Cu-containing layer 21 that contains Cu. The plating layers include an Ni plating layer 22 that covers the Cu-containing layer 21 by being formed on the Cu-containing layer 21, a Sn—Ni layer 23 that contains an intermetallic compound of Sn and Ni and covers the Ni plating layer 22 by being formed on the Ni plating layer 22, and a Sn plating layer 24 that covers a portion of the Sn—Ni layer 23 by being formed on that portion.

The Cu-containing layer 21 is formed, for example, by spreading a Cu paste on a predetermined area of the element housing 10A and baking that paste. Here, the sintered metal layer may be formed by baking a paste such as Ni, Ag, Pd, a Ag—Pd alloy, Au, or the like, for example. The Ni plating layer 22 and the Sn plating layer 24 are both formed through a process for plating the element housing 10A on which the sintered metal layer has been formed. Meanwhile, the Sn—Ni layer 23 is formed at a border area between the Ni plating layer 22 and the Sn plating layer 24 by, for example, subjecting the element housing 10A on which the Ni plating layer 22 and the Sn plating layer 24 have been formed to heat treatment or the like.

The first and second outer electrodes 20A1 and 20A2 will be described in further detail later.

As illustrated in FIGS. 1A to 2B, a direction in which the first and second outer electrodes 20A1 and 20A2 are arranged is defined as a length direction L of the multilayer ceramic capacitor 1A, a direction perpendicular or substantially perpendicular to a mounting surface of the multilayer ceramic capacitor 1A that is mounted onto a circuit board or the like defining and functioning as a mounting target is defined as a height direction H, and a direction perpendicular or substantially perpendicular to both the length direction L and the height direction H is defined as a width direction W. These terms will be used in the descriptions given hereinafter.

In this case, as illustrated in FIGS. 1A to 3, the element housing 10A includes first and second main surfaces 10a1 and 10a2 on opposite sides in the height direction H, first and second end surfaces 10b1 and 10b2 on opposite sides in the length direction L, and first and second side surfaces 10c1 and 10c2 on opposite sides in the width direction W. Of these, the first main surface 10a1 corresponds to the above-described mounting surface. In the present preferred embodiment, the direction in which the plurality of dielectric material layers and the plurality of conductive material layers 12 are laminated corresponds to the height direction H.

As illustrated in FIGS. 1A to 3, the first outer electrode 20A1 is provided so as to be continuous across the first end surface 10b1 of the element housing 10A and portions of the first and second main surfaces 10a1 and 10a2 and the first and second side surfaces 10c1 and 10c2 adjacent to the first end surface 10b1. Accordingly, as illustrated in FIGS. 2A and 2B, the first outer electrode 20A1 includes at least an end surface covering portion 20b that covers the first end surface 10b1 of the element housing 10A and a main surface covering portion 20a that covers a portion of the first main surface 10a1, which is the mounting surface of the element housing 10A, near the first end surface 10b1 thereof.

On the other hand, as illustrated in FIGS. 1A to 3, the second outer electrode 20A2 is provided so as to be continuous across the second end surface 10b2 of the element housing 10A and portions of the first and second main surfaces 10a1 and 10a2 and the first and second side surfaces 10c1 and 10c2 adjacent to the second end surface 10b2. Accordingly, as illustrated in FIGS. 2A and 2B, the second outer electrode 20A2 includes at least an end surface covering portion 20b that covers the second end surface 10b2 of the element housing 10A and a main surface covering portion 20a that covers a portion of the first main surface 10a1, which is the mounting surface of the element housing 10A, near the second end surface 10b2 thereof.

As illustrated in FIGS. 2A to 3, each of the plurality of conductive material layers 12 corresponds to an internal conductor embedded within the element housing 10A, and has a substantially rectangular shape extending in the length direction L and the width direction W. One of a pair of adjacent conductive material layers 12 that sandwich a dielectric material layer 11 in the height direction H is exposed at the first end surface 10b1 of the element housing 10A by being led out to the first end surface 10b1 (see FIG. 3 in particular). The other the pair of adjacent conductive material layers 12 that sandwich the dielectric material layer 11 in the height direction H is exposed at the second end surface 10b2 of the element housing 10A by being led out to the second end surface 10b2.

Accordingly, the one of the plurality of conductive material layers 12 is connected to the end surface covering portion 20b of the first outer electrode 20A1 at the first end surface 10b1, and the other of the plurality of conductive material layers 12 is connected to the end surface covering portion 20b of the second outer electrode 20A2 at the second end surface 10b2. Through this, the plurality of conductive material layers 12 located within the multilayer ceramic capacitor 1A define and function as internal electrode layers, and a plurality of capacitor elements are electrically connected in parallel between the first and second outer electrodes 20A1 and 20A2.

As illustrated in FIGS. 1A to 3, in the multilayer ceramic capacitor 1A according to the present preferred embodiment, a portion of the exposed surface of the main surface covering portion 20a and a portion of the exposed surface of the end surface covering portion 20b of the first and second outer electrodes 20A1 and 20A2 are defined by the Sn plating layer 24, and the remaining exposed surfaces of the first and second outer electrodes 20A1 and 20A2 are defined by the Sn—Ni layer 23.

To be more specific, the first and second outer electrodes 20A1 and 20A2 include three layers, namely the Cu-containing layer 21, the Ni plating layer 22, and the Sn—Ni layer 23 throughout the entirety thereof, and a portion of the Sn—Ni layer 23, which is the outermost of those three layers, is further covered by the Sn plating layer 24. Accordingly, a portion of each of the first and second outer electrodes 20A1 and 20A2 includes four layers, namely the Cu-containing layer 21, the Ni plating layer 22, the Sn—Ni layer 23, and the Sn plating layer 24.

Here, the portion of the Sn—Ni layer 23 covered by the Sn plating layer 24 primarily corresponds to a portion of the main surface covering portion 20a excluding the end portion thereof located on the side opposite from the end surface covering portion 20b, and the end portion of the end surface covering portion 20b on the main surface covering portion 20a side thereof. In other words, the Sn plating layer 24 extends from the main surface covering portion 20a to the end portion of the end surface covering portion 20b on the main surface covering portion 20a side thereof, and is continuous across substantially the entire main surface covering portion 20a and the end portion of the end surface covering portion 20b on the main surface covering portion 20a side thereof.

As a result, in the multilayer ceramic capacitor 1A, large portions of the exposed surfaces of the first and second outer electrodes 20A1 and 20A2 located on the first main surface 10a1 of the element housing 10A, which is the above-described mounting surface, are defined by the Sn plating layer 24, and large portions of the remaining exposed surfaces are defined by the Sn—Ni layer 23.

Figure 4A:
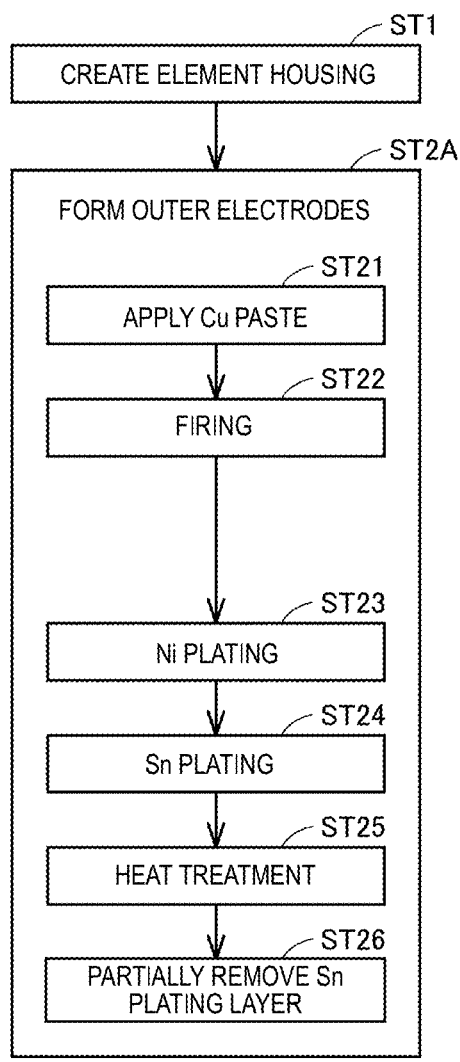
FIGS. 4A and 4B are flowcharts illustrating methods for manufacturing the multilayer ceramic capacitor according to the first preferred embodiment of the present invention and a multilayer ceramic capacitor according to a variation.
Figure 4B:
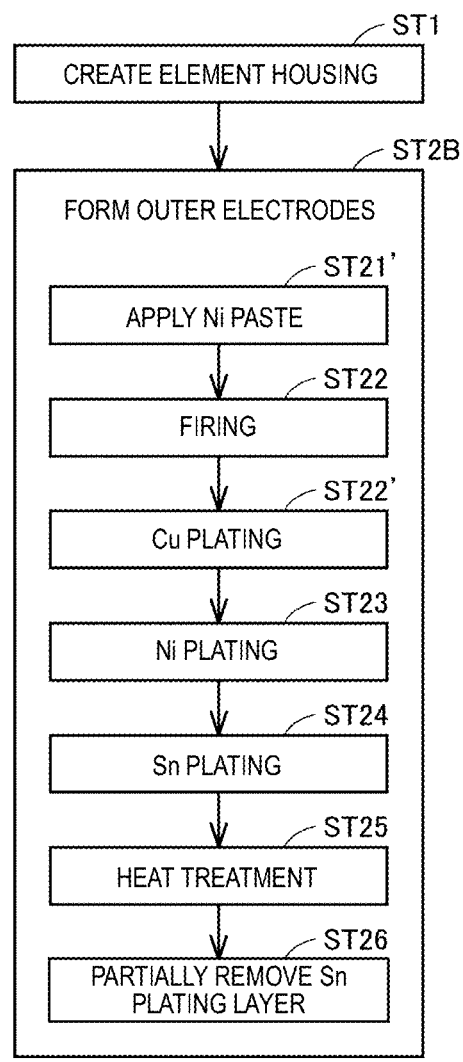
Figure 5A:
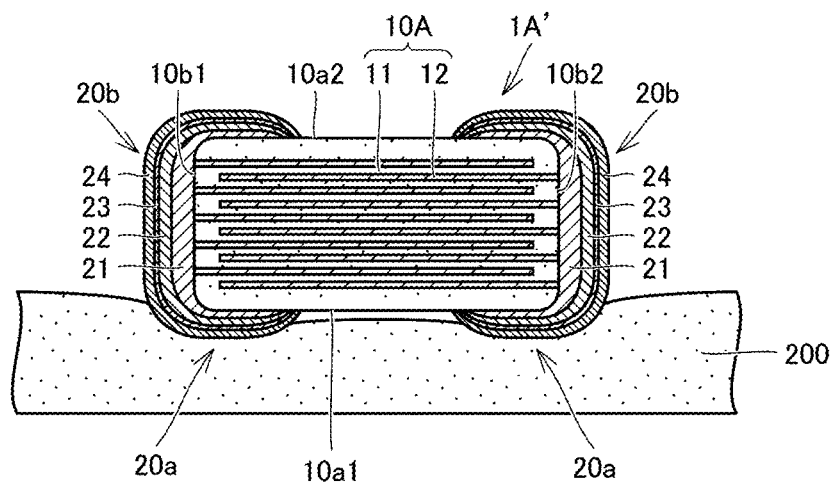
FIGS. 5A and 5B are schematic diagrams illustrating a process of partially removing a Sn plating layer, indicated in FIGS. 4A and 4B.
Figure 5B:
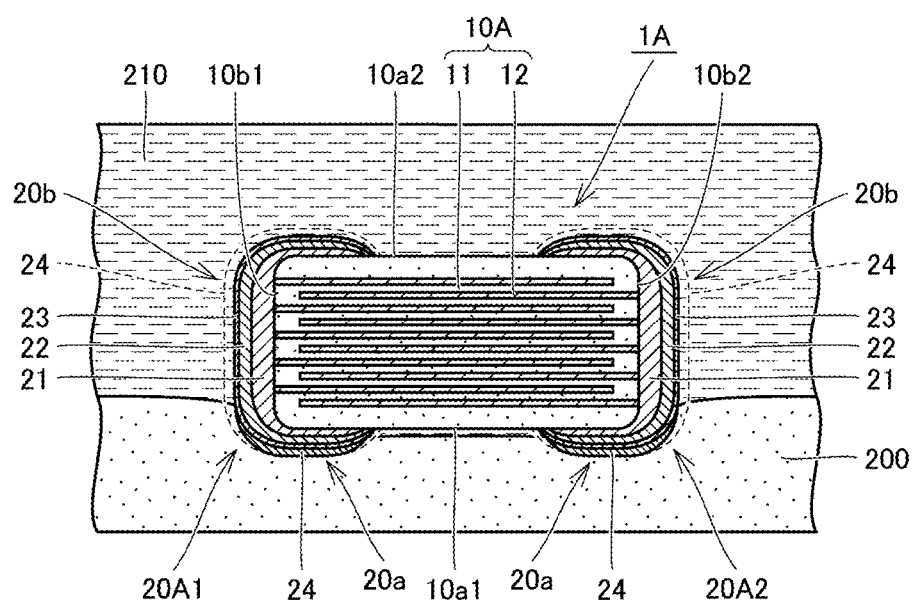

FIG. 4A is a flowchart illustrating a method for manufacturing the multilayer ceramic capacitor according to the present preferred embodiment, and FIG. 4B is a flowchart illustrating a method for manufacturing the multilayer ceramic capacitor according to a variation based on the present preferred embodiment. FIGS. 5A and 5B, meanwhile, are schematic diagrams illustrating a process of partially removing the Sn plating layer, indicated in FIGS. 4A and 4B. A non-limiting example of a method for manufacturing the multilayer ceramic capacitor 1A will be described hereinafter with reference to FIGS. 4A to 5B.

As illustrated in FIG. 4A, when manufacturing the multilayer ceramic capacitor 1A according to the present preferred embodiment, the element housing 10A is first manufactured in step ST1, and the first and second outer electrodes 20A1 and 20A2 are then formed in step ST2A.

To be more specific, in step ST1, the element housing 10A is created by preparing a plurality of raw material sheets in which a conductive paste that will define and function as the conductive material layers 12 is printed onto the surface of a ceramic sheet that will define and function as the dielectric material layers 11, and then laminating, pressure-bonding, and firing the plurality of raw material sheets. Here, a plurality of element housings 10A may be manufactured together by preparing a collection of a plurality of integrated element housings 10A in advance and cutting that collection into individual element housings 10A.

The size of the element housing 10A preferably is approximately 0.6 mm in the length direction L and approximately 0.3 mm in both the width direction W and the height direction H, as one example; however, the dimensions are not particularly limited thereto.

In step ST2A, first, Cu paste is spread on portions of the element housing 10A including the first and second end surfaces 10b1 and 10b2 (step ST21). Next, the Cu paste is fired (step ST22), forming the Cu-containing layer 21 that defines and functions as the sintered metal layer.

The thickness of the Cu-containing layer 21 is preferably set to have a maximum thickness of approximately 25 μm in an area corresponding to the end surface covering portion 20b and a maximum thickness of approximately 15 μm in an area corresponding to the main surface covering portion 20a, for example; however, the thickness is not particularly limited thereto.

Next, the Ni plating layer 22 is formed on the Cu-containing layer 21 by dipping the element housing 10A on which the Cu-containing layer 21 is formed into a plating bath for the Ni plating process (step ST23), after which the Sn plating layer 24 is formed on the Ni plating layer 22 by dipping the element housing 10A on which the Ni plating layer 22 has been formed into a plating bath for the Sn plating process (step ST24). Note that the entire surface of the Ni plating layer 22 is covered by the Sn plating layer 24 at this point in time.

The thicknesses of the Ni plating layer 22 and the Sn plating layer 24 preferably are, for example, approximately no less than 2 μm and no more than 4 μm for the Ni plating layer 22 and approximately no less than 3 μm and no more than 5 μm for the Sn plating layer 24, but the thicknesses are not particularly limited thereto.

Next, the element housing 10A on which the Sn plating layer 24 has been formed is subjected to a heat treatment (step ST25). This heat treatment is a process that promotes diffusion of the Sn element and/or the Ni element at border areas between the Ni plating layer 22 and the Sn plating layer 24, forming a Sn and Ni intermetallic compound to define and function as the Sn—Ni layer 23.

While the conditions of this heat treatment are not particularly limited, it is preferable for the heat treatment to be carried out for approximately 10 minutes or more in an approximately no less than 100° C. and no more than 200° C. atmosphere. Although the Sn—Ni layer 23 is formed with certainty by carrying out the heat treatment, the Sn—Ni layer 23 can also be formed to a certain extent even if the heat treatment is omitted.

Next, the Sn plating layer 24 is partially removed from the element housing 10A following the formation of the Sn—Ni layer 23 (step ST26). For example, the following method can be used as a method for selectively removing a portion of the Sn plating layer 24.

As illustrated in FIG. 5A, first, the element housing 10A following the formation of the Sn—Ni layer 23 (in other words, a half-way processed multilayer ceramic capacitor 1A') is affixed to an adhesive sheet 200. At this time, the first main surface 10a1 side of the element housing 10A, which is the above-described mounting surface, is affixed to the adhesive sheet 200. It is preferable that a sheet having a suitable elasticity be used as the adhesive sheet 200, and thus a foam separable sheet, for example, can be used favorably.

At this time, the main surface covering portion 20a of the multilayer ceramic capacitor 1A' is covered by the adhesive sheet 200. Here, the exposed surface of the element housing 10A located between the pair of main surface covering portions 20a (that is, the first main surface 10a1 of the element housing 10A) may or may not be covered by the adhesive sheet 200.

In the present preferred embodiment, appropriately adjusting the elasticity of the adhesive sheet 200 and appropriately adjusting the force with which the multilayer ceramic capacitor 1A' is pressed against the adhesive sheet 200 makes it possible to avoid covering the exposed surface of the element housing 10A with the adhesive sheet 200. By doing so, after a portion of the Sn plating layer 24 has been selectively removed, the exposed surface of the end portion corresponding to a portion of the main surface covering portion 20a that intersects with the first main surface 10a1 (in particular, the exposed surface at the end portion of the main surface covering portion 20a located on the side opposite from the end surface covering portion 20b) can be defined by the Sn—Ni layer 23.

Next, as illustrated in FIG. 5B, the multilayer ceramic capacitor 1A' is immersed along with the adhesive sheet 200 in a separating liquid 210 while the multilayer ceramic capacitor 1A' remains affixed to the adhesive sheet 200. An etchant capable of selectively dissolving Sn can be used as the separating liquid 210, and for example, ENSTRIP TL-105, produced by Meltex, can be used favorably.

By immersing the multilayer ceramic capacitor 1A' in the separating liquid 210 for a predetermined amount of time, the portions of the Sn plating layer 24 not covered by the adhesive sheet 200 are selectively removed, exposing the Sn—Ni layer 23 where the Sn plating layer 24 has been removed. Through this, a portion of the Sn plating layer 24 is selectively removed from the element housing 10A following the formation of the Sn—Ni layer 23. In the case where the Sn plating layers 24 of a plurality of multilayer ceramic capacitors 1A' are to be removed simultaneously, it is preferable that a predetermined gap be provided between each of the plurality of multilayer ceramic capacitor 1A' affixed to the adhesive sheet 200.

Note that the Sn—Ni layer 23 has a darker color than the Sn plating layer 24, and exhibits a color that is relatively close to gray or black. Accordingly, the orientation of the multilayer ceramic capacitor 1A is able to be determined easily by checking the color of the exposed surfaces of the first and second outer electrodes 20A1 and 20A2.

The multilayer ceramic capacitor 1A according to the present preferred embodiment can be manufactured with ease as described above.

Meanwhile, a non-limiting example of a manufacturing method illustrated in FIG. 4B can also be used to manufacture a multilayer ceramic capacitor according to a variation on the configuration of the multilayer ceramic capacitor 1A according to the present preferred embodiment as described above. In the multilayer ceramic capacitor according to the variation, the sintered metal layer is defined by a Ni-containing layer that contains Ni rather than a Cu-containing layer that contains Cu. A Cu plating layer is formed on this Ni-containing layer, and the Ni plating layer 22, the Sn—Ni layer 23, and the Sn plating layer 24 are then formed on that Cu plating layer (with the Sn plating layer 24 being partially formed).

Specifically, in the manufacturing method according to the variation, the element housing 10A is manufactured in step ST1, and the first and second outer electrodes 20A1 and 20A2 are then formed in step ST2B.

In step ST2B, first, Ni paste is spread on portions of the element housing 10A including the first and second end surfaces 10b1 and 10b2 (step ST21'). Next, the entire element housing 10A including the Ni paste is fired (step ST22), forming the Ni-containing layer that defines and functions as the sintered metal layer.

Next, the Cu plating layer is formed on the Ni-containing layer by dipping the element housing 10A on which the Ni-containing layer is formed into a plating bath for the Cu plating process (step ST22'). Next, the Ni plating layer 22 is formed on the Cu plating layer by dipping the element housing 10A on which the Cu plating layer is formed into a plating bath for the Ni plating process (step ST23), after which the Sn plating layer 24 is formed on the Ni plating layer 22 by dipping the element housing 10A on which the Ni plating layer 22 has been formed into a plating bath for the Sn plating process (step ST24).

Next, the element housing 10A on which the Sn plating layer 24 has been formed is subjected to a heat treatment (step ST25), the Sn—Ni layer 23 is formed by forming an intermetallic compound of Sn and Ni, and the Sn plating layer 24 is then partially removed from the element housing 10A following the formation of the Sn—Ni layer 23 (step ST26).

The multilayer ceramic capacitor according to the variation of a preferred embodiment of the present invention is manufactured with ease as described above.

The method for manufacturing the multilayer ceramic capacitor according to the above-described preferred embodiment of the present invention and the method for manufacturing the multilayer ceramic capacitor according to the variation thereof can be summarized as follows.

The manufacturing method is a method for manufacturing a multilayer ceramic capacitor that defines and functions as an electronic component, the method including the steps of manufacturing an element housing defining and functioning as a component main body including an end surface on which a conductive material layer defining and functioning as an embedded internal conductor is exposed and a main surface that is continuous with the end surface and intersects with the end surface, and providing an outer electrode on an outer surface of the element housing that covers at least the portion of the conductive material layer of the element housing exposed on the end surface such that the outer electrode includes an end surface covering portion connected to the conductive material layer and a main surface covering portion that covers at least a portion of the main surface.

In this manufacturing method, the step of providing an outer electrode includes the steps of: forming a Ni plating layer; forming a Sn plating layer on the Ni plating layer; forming a Sn—Ni layer containing an intermetallic compound of Sn and Ni at a border area between the Ni plating layer and the Sn plating layer; and after the Sn—Ni layer has been formed, selectively removing a portion of the Sn plating layer so that at least a portion of an exposed surface of the main surface covering portion is defined by the Sn plating layer and at least a portion of an exposed surface of the end surface covering portion is defined by the Sn—Ni layer.

Using this manufacturing method makes it possible to manufacture the multilayer ceramic capacitor according to the above-described preferred embodiment of the present invention and the multilayer ceramic capacitor according to the variation thereof with ease, and the following effects are achieved by the multilayer ceramic capacitor when manufactured as an electronic component through the above-described manufacturing method.

Figure 6:
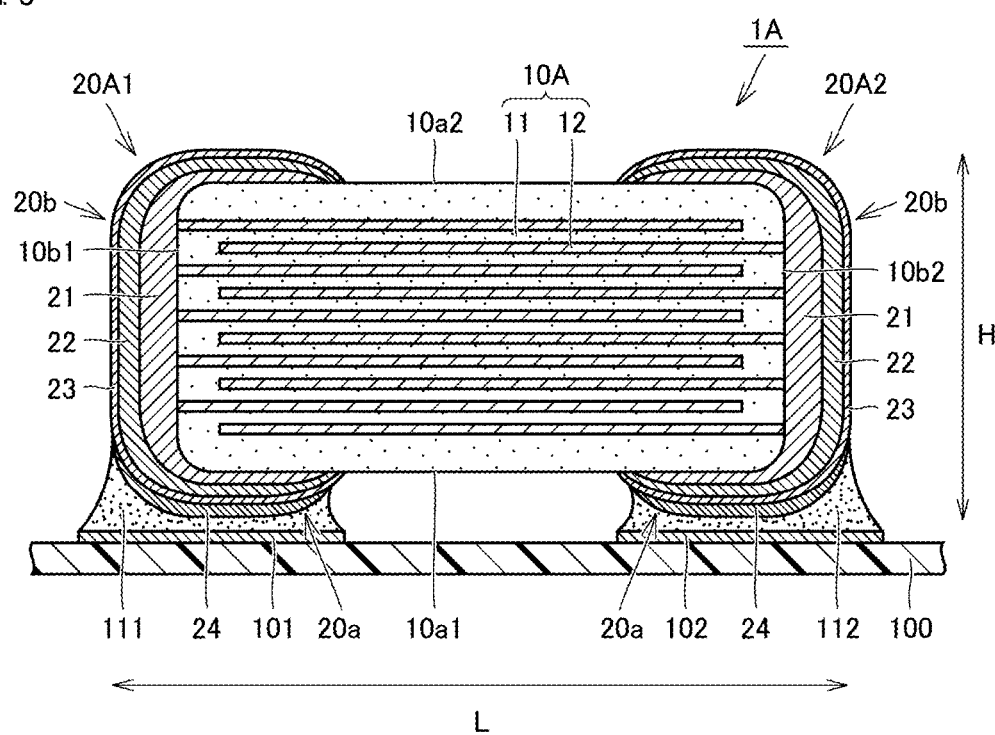
FIG. 6 is a schematic cross-sectional view illustrating a mounting structure including the multilayer ceramic capacitor according to the first preferred embodiment of the present invention.
Figure 7A:
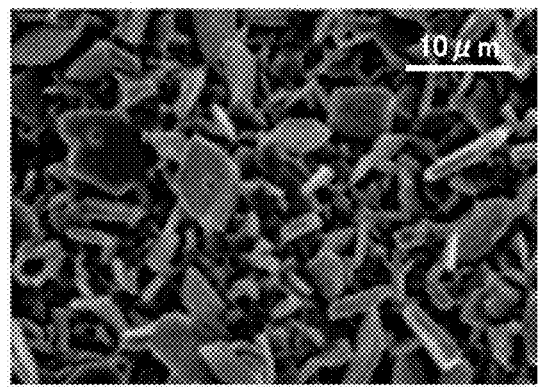
FIGS. 7A and 7B are microscope photographs of the surfaces of a Sn—Ni layer and a Ni plating layer, respectively.
Figure 7B:
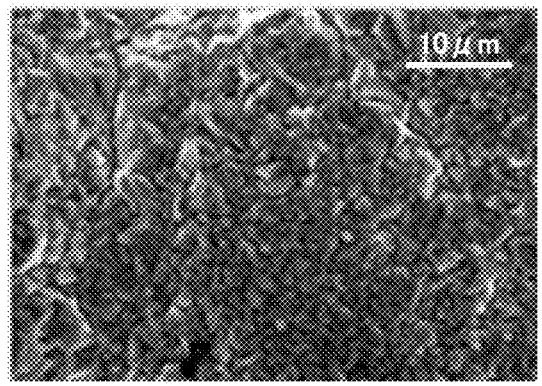

FIG. 6 is a schematic cross-sectional view illustrating a mounting structure including the multilayer ceramic capacitor according to the present preferred embodiment. FIGS. 7A and 7B are microscope photographs of the surfaces of the Sn—Ni layer and the Ni plating layer, respectively. Next, the configuration of a mounting structure including the multilayer ceramic capacitor 1A according to the present preferred embodiment, and effects achieved by the multilayer ceramic capacitor 1A according to the present preferred embodiment, will be described with reference to FIGS. 6 to 7B.

As illustrated in FIG. 6, the multilayer ceramic capacitor 1A according to the present preferred embodiment is disposed so that the first main surface 10a1 of the element housing 10A, which defines and functions as the above-described mounting surface, opposes a main surface of a circuit board 100 defining and functioning as the mounting target, and is mounted in this state using solder. A mounting structure including the multilayer ceramic capacitor 1A and the circuit board 100 is formed as a result.

The circuit board 100 is an insulative board including a conductive pattern provided on the main surface thereof, which opposes the multilayer ceramic capacitor 1A. A resinous material such as an epoxy resin, a ceramic material such as alumina, or a material in which a filler, a woven fabric, or the like configured of an inorganic material or an organic material is added to the above-described materials can be used as the material of the circuit board 100. Generally speaking, it is preferable that a glass epoxy substrate, in which a woven fabric made of glass is added to a substrate configured of an epoxy resin, be used as the circuit board 100.

First and second lands 101 and 102 are provided on the main surface of the circuit board 100 so as to correspond to the multilayer ceramic capacitor 1A. The first and second lands 101 and 102 correspond to respective portions of the conductive pattern, and are separated from each other.

Each of the first and second lands 101 and 102 preferably has a size that corresponds to the first or second outer electrode 20A1 or 20A2 of the multilayer ceramic capacitor 1A corresponding thereto, and includes a portion that opposes the corresponding first or second outer electrode 20A1 or 20A2 along a normal direction of the main surface of the circuit board 100. While various types of conductive materials can be used as the material of the first and second lands 101 and 102, a metal material such as Cu is generally used favorably.

The first and second outer electrodes 20A1 and 20A2 of the multilayer ceramic capacitor 1A and the first and second lands 101 and 102 provided on the circuit board 100 are bonded together by solder 111 and 112, respectively.

As described above, in the multilayer ceramic capacitor 1A, large portions of the exposed surfaces of the first and second outer electrodes 20A1 and 20A2 located on the first main surface 10a1 side of the element housing 10A, which is the above-described mounting surface, are defined by the Sn plating layer 24, and large portions of the remaining exposed surfaces are defined by the Sn—Ni layer 23.

Generally speaking, the Sn—Ni layer has significantly poorer solder wettability than the Sn plating layer, which has good solder wettability, and also has poorer solder wettability than the Ni plating layer, which has comparatively good solder wettability. Accordingly, when mounting the multilayer ceramic capacitor 1A, it is difficult for molten solder to spread out at the portions of the first and second outer electrodes 20A1 and 20A2 where the exposed surface is defined by the Sn—Ni layer 23, whereas the molten solder spreads out at the portions of the first and second outer electrodes 20A1 and 20A2 where the exposed surface is defined by the Sn plating layer 24.

Although the intermetallic compound of Sn and Ni has a poorer solder wettability than Sn, the surface shape of the Sn—Ni layer at the microscopic level is also considered to be another factor in the poor solder wettability of the Sn—Ni layer. In other words, as seen in FIG. 7A, many fine projections are present in the surface of the Sn—Ni layer after the Sn plating layer has been removed by the separating liquid, and the projections have flat or substantially flat flake shapes. As opposed to this, the surface of the Ni plating layer prior to the Sn plating layer being formed is comparatively smooth, as seen in FIG. 7B. Accordingly, it is assumed that the presence of the flat or substantially flat flake shaped projections is a factor in the poor solder wettability of the Sn—Ni layer.

Accordingly, in the post-mounting state, large portions of the main surface covering portions 20a of the first and second outer electrodes 20A1 and 20A2 are bonded to the first and second lands 101 and 102 by the solder 111 and 112, respectively, whereas large portions of the end surface covering portions 20b are not bonded to the first and second lands 101 and 102 by the solder 111 and 112 and remain exposed, as illustrated in FIG. 6.

Accordingly, the sizes of bonding portions defined by the solder 111 and 112 (solder fillets, in other words) are able to be controlled as appropriate, tensile stress produced by thermal contraction of the solder fillet is appropriately reduced, and as a result, cracks are suppressed or prevented from forming in the element housing 10A.

Accordingly, in the multilayer ceramic capacitor 1A according to the present preferred embodiment, cracks are suppressed or prevented from forming in the element housing 10A due to thermal contraction in the solder fillets, which makes it possible to greatly suppress or prevent a degradation in electrical characteristics, such as shorting in the internal electrode layers and a decrease in electrostatic capacitance, as compared to past techniques.

There is an existing technique that controls the sizes of the solder fillets by partially or completely covering the end surface covering portion of an outer electrode by a film formed from a resinous material, a glass material, a ceramic material, or the like. However, this technique has problems, such as the film peeling away, or the manufacturing process becoming extremely complicated and the multilayer ceramic capacitor increasing in size due to the additional film being formed.

As opposed to this, by using the configuration according to the present preferred embodiment, there is no opportunity for the problem of peeling to occur, and problems such as the manufacturing process becoming extremely complicated, the multilayer ceramic capacitor increasing in size, and so on cannot occur either.

In the multilayer ceramic capacitor 1A according to the present preferred embodiment as described above, the exposed surface on the end portion of the main surface covering portion 20a located on the side opposite from the end surface covering portion 20b is defined by the Sn—Ni layer 23, and the exposed surface on the end portion of the end surface covering portion 20b located on the main surface covering portion 20a side is defined by the Sn plating layer 24.

By using this configuration, after mounting, the solder 111 and 112 are positioned away from the exposed surface of the element housing 10A, at the end portion of the main surface covering portion 20a located on the side opposite from the end surface covering portion 20b. This makes it possible to ensure that stress does not concentrate at border areas between the element housing 10A and the first and second outer electrodes 20A1 and 20A2, and in this sense as well, cracks are suppressed or prevented from forming in the element housing 10A due to thermal contraction of the solder fillets.

Meanwhile, after mounting, the solder can spread out appropriately at the end portion of the end surface covering portion 20b on the main surface covering portion 20a side, making it possible to form the solder fillets of an appropriate size and increasing the mounting stability of the multilayer ceramic capacitor 1A.

Figure 8:
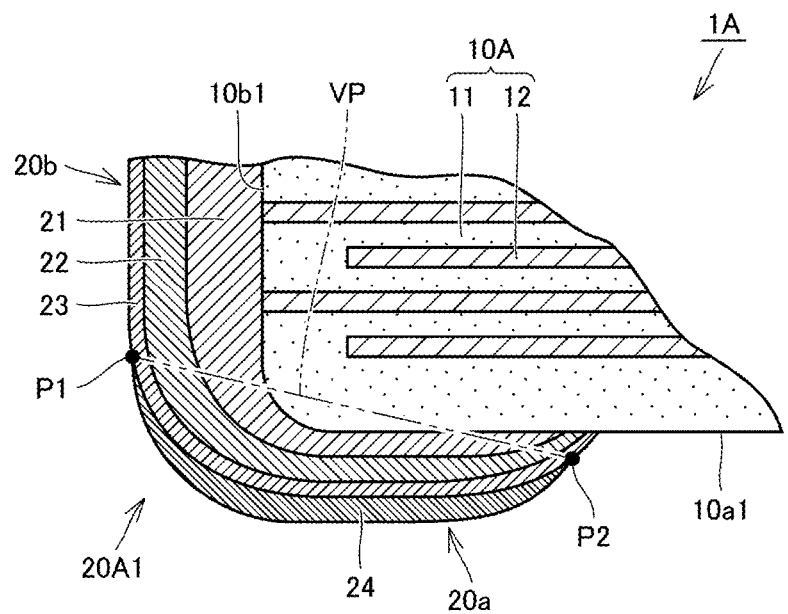
FIG. 8 is a cross-sectional view illustrating primary elements of the multilayer ceramic capacitor according to the first preferred embodiment of the present invention, in an enlarged manner.

FIG. 8 is a cross-sectional view illustrating primary elements of the multilayer ceramic capacitor according to the present preferred embodiment, in an enlarged manner. As illustrated in FIG. 8, the multilayer ceramic capacitor 1A according to the present preferred embodiment is preferably formed so that a conductive material layer 12 is not located on an imaginary plane VP that follows the shortest path connecting between an edge portion on the end surface covering portion 20b (a point of this edge portion is indicated by a point P1 in FIG. 8) and an edge portion on the main surface covering portion 20a (a point of this edge portion is indicated by a point P2 in FIG. 8) in the Sn plating layer 24 extending from the main surface covering portion 20a to the end portion of the end surface covering portion 20b on the main surface covering portion 20a side.

According to such a configuration, even if a crack has formed in the element housing 10A, the chance that the crack will reach the conductive material layers 12 is greatly reduced, which makes it possible to even further greatly suppress or prevent a degradation in electrical characteristics, such as shorting in the internal electrode layers and a decrease in electrostatic capacitance. Although only the side on which the first outer electrode 20A1 is located is illustrated in FIG. 8, it is preferable that the same configuration be provided on the side on which the second outer electrode 20A2 is located.

A scanning electron microscope (SEM) can be used to analyze the structure of the exposed surfaces of the outer electrodes. EDX included in the SEM can be used to analyze the composition of the surface layer portions of the outer electrodes. Using EDX makes it possible to confirm whether Ni is present or Si is present in the surface layer portions of the outer electrodes. Furthermore, an X-ray diffractometer (XRD) can also be used to analyze the composition of the surface layer portions of the outer electrodes. Whether or not the intermetallic compound of Sn and Ni is present in the surface layer portions of the outer electrode can be confirmed by using the XRD.

Figure 9A:
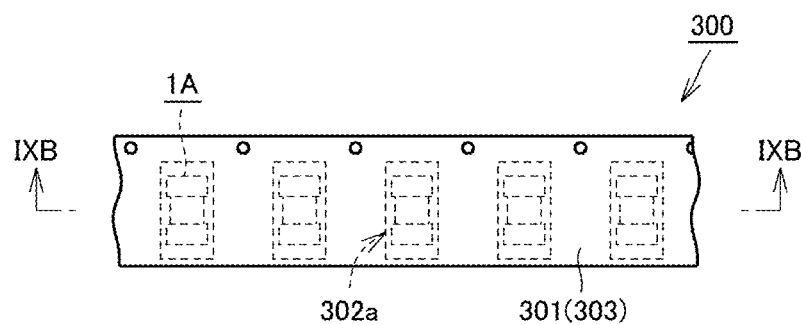
FIGS. 9A and 9B are a plan view and a cross-sectional view, respectively, illustrating a multilayer ceramic capacitor series according to a first preferred embodiment of the present invention.
Figure 9B:
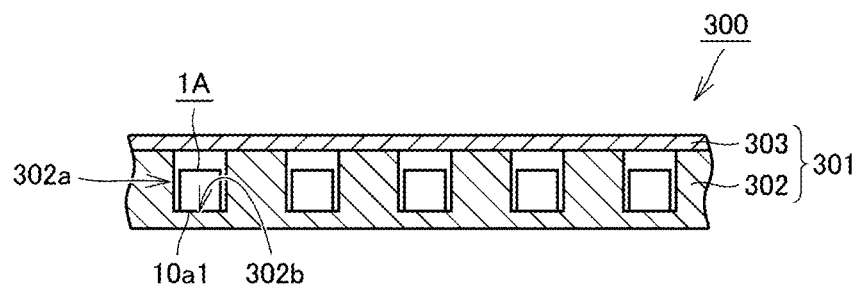

FIGS. 9A and 9B are a plan view and a cross-sectional view, respectively, illustrating a multilayer ceramic capacitor series according to the present preferred embodiment. The cross-section illustrated in FIG. 9B is a cross-section taken along an IXB-IXB line indicated in FIG. 9A. A multilayer ceramic capacitor series 300 according to the present preferred embodiment will be described next with reference to FIGS. 9A and 9B.

As illustrated in FIGS. 9A and 9B, the multilayer ceramic capacitor series 300 according to the present preferred embodiment includes a plurality of the multilayer ceramic capacitors 1A according to other preferred embodiments of the present invention described above, and a package 301 that packages the plurality of multilayer ceramic capacitors 1A together. The package 301 includes an elongated-shaped carrier tape 302 in which a plurality of recesses 302a that each holds one of the plurality of multilayer ceramic capacitors 1A are provided with intervals therebetween, and a cover tape 303 that is affixed to the carrier tape 302 so as to cover the plurality of recesses 302a. Each of the plurality of multilayer ceramic capacitors 1A is housed inside a corresponding recess 302a so that the first main surface 10a1 of each element housing 10A faces toward a base portion 302b of the corresponding recess 302a.

The plurality of multilayer ceramic capacitors 1A contained in the multilayer ceramic capacitor series 300 are mounted onto the circuit board 100 by being extracted from the package 301 one at a time. Specifically, with the cover tape 303 peeled off the carrier tape 302, the multilayer ceramic capacitor 1A is suctioned and held by a suction head such as a chip mounter from the second main surface 10a2 side of the element housing 10A, and is extracted from the carrier tape 302 in this manner and mounted on the circuit board 100.

Accordingly, the multilayer ceramic capacitor 1A is held within the recess 302a of the carrier tape 302 such that the first main surface 10a1 of the element housing 10A thereof faces toward the base portion 302b of the recess 302a, and thus the mounting operation performed by the chip mounter or the like can be carried out smoothly. Accordingly, by using the multilayer ceramic capacitor series 300 according to the present preferred embodiment, a mounting structure including the multilayer ceramic capacitor 1A can be manufactured with ease.

Second Preferred Embodiment

Figure 10A:
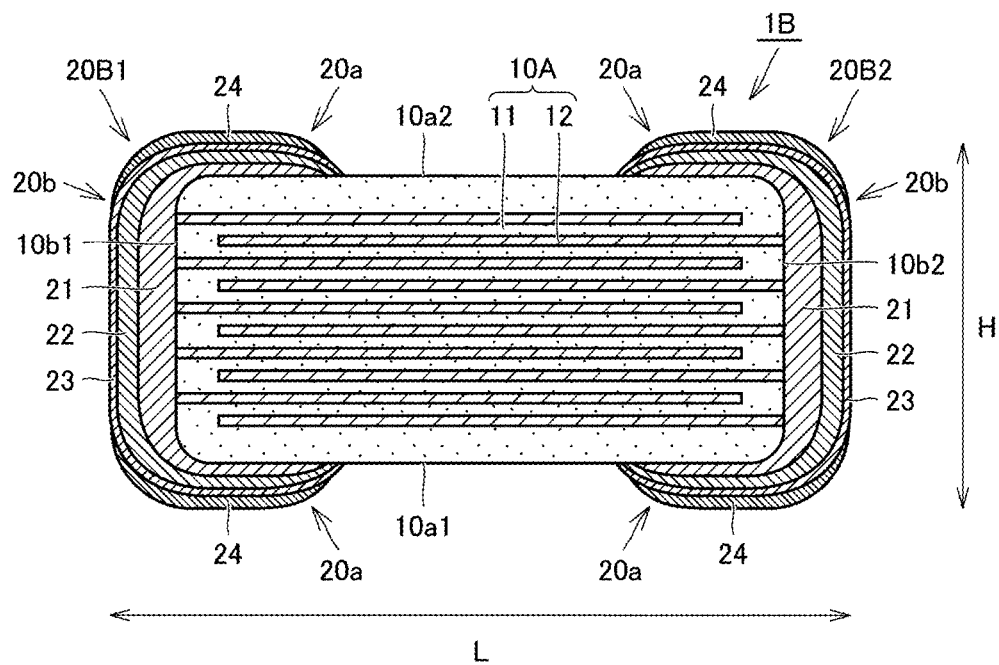
FIGS. 10A and 10B are schematic cross-sectional views illustrating a multilayer ceramic capacitor according to a second preferred embodiment of the present invention.
Figure 10B:
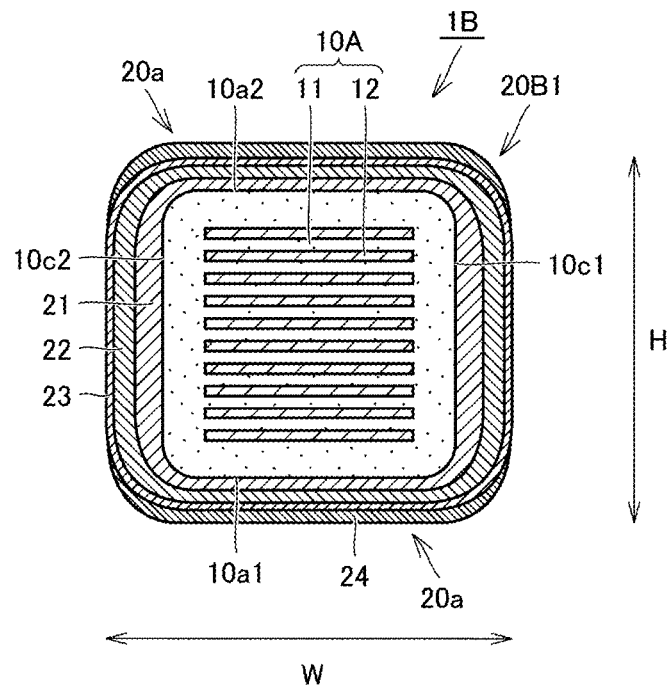

FIGS. 10A and 10B are schematic cross-sectional views illustrating a multilayer ceramic capacitor according to a second preferred embodiment of the present invention. A multilayer ceramic capacitor 1B according to the present preferred embodiment will be described next with reference to FIGS. 10A and 10B.

As illustrated in FIGS. 10A and 10B, the multilayer ceramic capacitor 1B according to the present preferred embodiment differs from the multilayer ceramic capacitor 1A only in that the multilayer ceramic capacitor 1B includes first and second outer electrodes 20B1 and 20B2 having different configurations from the outer electrodes of the multilayer ceramic capacitor 1A.

To be more specific, while the first and second outer electrodes 20A1 and 20A2 of the multilayer ceramic capacitor 1A are configured such that the exposed surface of only the main surface covering portion 20a located on the first main surface 10a1 side of the element housing 10A is primarily covered by the Sn plating layer 24, the first and second outer electrodes 20B1 and 20B2 of the multilayer ceramic capacitor 1B according to the present preferred embodiment are configured such that the exposed surfaces of both the main surface covering portion 20a located on the first main surface 10a1 side of the element housing 10A and the main surface covering portion 20a located on the second main surface 10a2 side are primarily covered by the Sn plating layer 24.

By using such a configuration, both the first main surface 10a1 side of the element housing 10A and the second main surface 10a2 side of the element housing 10A define and function as mounting surfaces for the mounting target, and thus in addition to the effects described in the first preferred embodiment of the present invention, the multilayer ceramic capacitor 1B is able to be mounted to the mounting target regardless of the orientation of the multilayer ceramic capacitor 1B with respect to the height direction H.

Third Preferred Embodiment

Figure 11A:
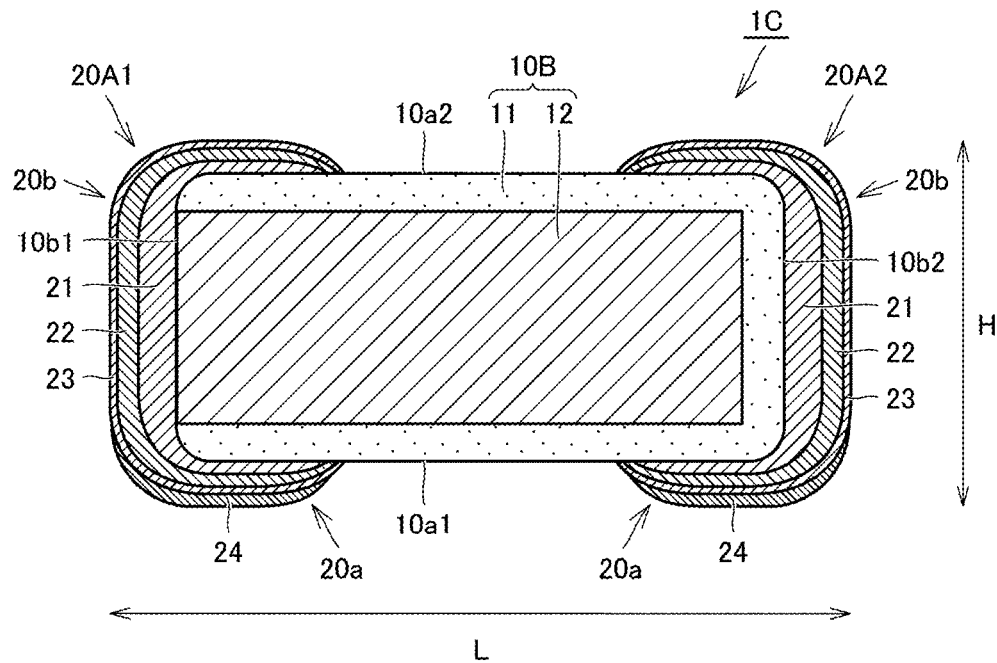
FIGS. 11A and 11B are schematic cross-sectional views illustrating a multilayer ceramic capacitor according to a third preferred embodiment of the present invention.
Figure 11B:
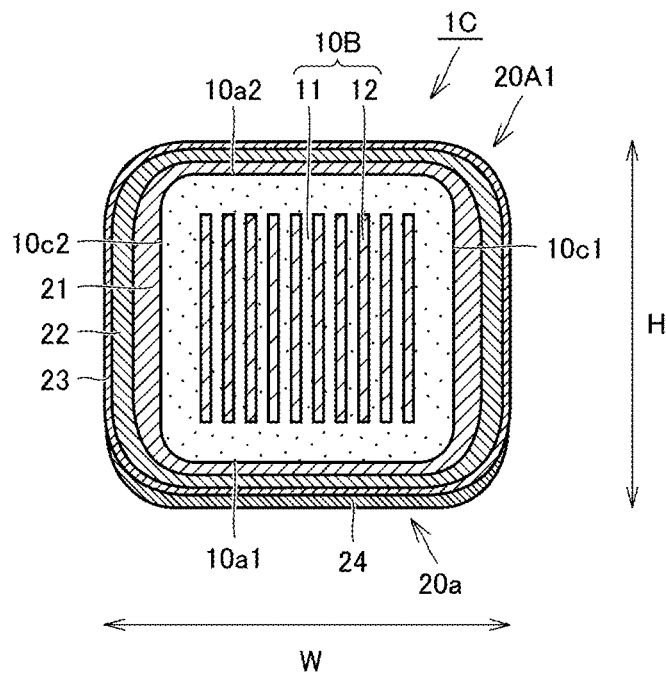

FIGS. 11A and 11B are schematic cross-sectional views illustrating a multilayer ceramic capacitor according to a third preferred embodiment of the present invention. A multilayer ceramic capacitor 1C according to the present preferred embodiment will be described next with reference to FIGS. 11A and 11B.

As illustrated in FIGS. 11A and 11B, the multilayer ceramic capacitor 1C according to the present preferred embodiment differs from the multilayer ceramic capacitor 1A only in that the multilayer ceramic capacitor 1C includes an element housing 10B having a different configuration from the element housing of the multilayer ceramic capacitor 1A.

To be more specific, while the element housing 10A included in the multilayer ceramic capacitor 1A is configured such that the direction in which the dielectric material layers 11 and the conductive material layers 12 are laminated matches the height direction H of the multilayer ceramic capacitor 1A, the element housing 10B included in the multilayer ceramic capacitor 1C according to the present preferred embodiment is configured such that the direction in which the dielectric material layers 11 and the conductive material layers 12 are laminated matches the width direction W of the multilayer ceramic capacitor 1C.

The same effects as those described in the first preferred embodiment are achieved even with such a configuration.

Although the first to third preferred embodiments of the present invention describe the exposed surface of the end portion of the main surface covering portion located on the side opposite from the end surface covering portion, provided on the side corresponding to the mounting surface of the multilayer ceramic capacitor, and being defined by the Sn—Ni layer, and the exposed surfaces of the remaining portions of the main surface covering portion being defined by the Sn plating layer, the entire exposed surface of the main surface covering portion may be defined by the Sn plating layer, and the exposed surface of yet another portion aside from the end portion of the main surface covering portion located on the side opposite from the end surface covering portion may be defined by the Sn—Ni layer. In other words, the above-described effects are able to be achieved to an equivalent degree as long as at least a portion of the exposed surface of the main surface covering portion is defined by the Sn plating layer.

In addition, although the first to third preferred embodiments of the present invention describe the end portion of the end surface covering portion of the multilayer ceramic capacitor located on the main surface covering portion side as being defined by the Sn plating layer and the exposed surfaces of the remaining portions of the end surface covering portion as being defined by the Sn—Ni layer, the entire exposed surface of the end surface covering portion may be defined by the Sn—Ni layer, and the exposed surface of yet another portion aside from the end portion of the end surface covering portion located on the main surface covering portion side may be defined by the Sn plating layer. In other words, the above-described effects are able to be achieved to an equivalent degree as long as at least a portion of the exposed surface of the end surface covering portion is defined by the Sn—Ni layer.

Furthermore, although the first to third preferred embodiments of the present invention describe a multilayer ceramic capacitor and a multilayer ceramic capacitor series including the same as examples of an electronic component and an electronic component series including the same in which the present invention is applied, the present invention can be applied to any electronic component mounted to a mounting target using solder, and to any electronic component series including the same. In this case, the number of outer electrodes bonded to the mounting target is not limited to two, and may be one, or three or more. Furthermore, in the case where two or more outer electrodes are provided, the above-described effects are able to be achieved to an equivalent degree as long as the present invention is applied in at least one of those outer electrodes.

The characteristic configurations described above in the first to third preferred embodiments of the present invention can of course be combined without departing from the essential spirit of the present invention.

In this manner, the preferred embodiments and variations disclosed herein are to be understood in all ways as exemplary and in no ways limiting. The technical scope of the present invention is defined by the scope of the appended claims, and all changes that fall within the same essential spirit as the scope of the claims are intended to be included therein as well.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a component main body in which an internal conductor is embedded; and
an outer electrode provided on an outer surface of the component main body; wherein
the component main body includes an end surface on which the internal conductor is exposed, and a main surface that is continuous with the end surface and intersects with the end surface;
the outer electrode includes an end surface covering portion connected to the internal conductor by covering at least a portion of the internal conductor exposed on the end surface, and a main surface covering portion that covers at least a portion of the main surface;
at least a portion of an exposed surface of the main surface covering portion includes a Sn plating layer;
at least a portion of an exposed surface of the end surface covering portion includes a Sn—Ni layer containing an intermetallic compound of Sn and Ni; and
at least a portion of the Sn—Ni layer is disposed underneath the Sn plating layer.

2. The electronic component according to claim 1, wherein a surface of the Sn—Ni layer of the exposed surface of the end surface covering portion includes a plurality of projections.

3. The electronic component according to claim 2, wherein the projections have flat or substantially flat flake shapes.

4. The electronic component according to claim 1, wherein the end surface covering portion includes a Ni plating layer, and the Sn—Ni layer of the exposed surface of the end surface covering portion provided on the Ni plating layer.

5. The electronic component according to claim 1, wherein the main surface covering portion includes a Ni plating layer, a Sn—Ni layer provided on the Ni plating layer, and the Sn plating layer of the exposed surface of the main surface covering portion provided on the Sn—Ni layer.

6. The electronic component according to claim 4, wherein the end surface covering portion and/or the main surface covering portion includes a Cu-containing layer containing Cu and the Ni plating layer provided on the Cu-containing layer.

7. The electronic component according to claim 1, wherein an exposed surface on an end portion of the main surface covering portion, the end portion being a portion that intersects with the main surface, includes a Sn—Ni layer containing an intermetallic compound of Sn and Ni.

8. The electronic component according to claim 1, wherein the Sn plating layer of the exposed surface of the main surface covering portion extends from the main surface covering portion to a portion of the end surface covering portion.

9. The electronic component according to claim 8, wherein the internal conductor is not located on an imaginary plane that follows a shortest path between an edge portion on the end surface covering portion and an edge portion on the main surface covering portion in the Sn plating layer extending from the main surface covering portion to a portion of the end surface covering portion.

10. The electronic component according to claim 1, wherein the electronic component is a multilayer ceramic capacitor.

11. The electronic component according to claim 1, wherein the outer electrode includes a sintered metal layer and plating layers laminated together.

12. The electronic component according to claim 1, wherein the outer electrode includes a Cu-containing layer, an Ni plating layer, and the Sn—Ni layer throughout an entirety thereof.

13. The electronic component according to claim 12, wherein a portion of the Sn—Ni layer is covered by the Sn plating layer.

14. The electronic component according to claim 1, wherein exposed surfaces of both the main surface covering portion located on a first main surface side of the component main body and the main surface covering portion located on a second main surface side are covered by the Sn plating layer.

15. The electronic component according to claim 1, wherein the component main body defines an element housing and includes a plurality of dielectric material layers and a plurality of conductive material layers laminated in a height direction of the electronic component.

16. The electronic component according to claim 1, wherein the component main body defines an element housing and includes a plurality of dielectric material layers and a plurality of conductive material layers laminated in a width direction of the electronic component.

17. A mounting structure comprising:
a circuit board including a land;
the electronic component according to claim 1 mounted on the circuit board such that the land is connected to the outer electrode by solder.

18. The mounting structure according to claim 17, wherein the solder is spaced away from the exposed surface of the main surface covering portion located on a side opposite from the end surface covering portion.

19. An electronic component series comprising:
a plurality of the electronic components according to claim 1; and
a package including an elongated carrier tape provided with a plurality of recesses with intervals therebetween, and a cover tape affixed to the carrier tape so as to cover the plurality of recesses; wherein
the plurality of electronic components are accommodated in the plurality of corresponding recesses such that the main surface of each of the plurality of electronic components faces a base portion of each of the plurality of corresponding recesses.

20. The electronic component series according to claim 19, wherein the plurality of electronic components are multilayer ceramic capacitors.

\* \* \* \* \*